United States Patent
Chikyo et al.

(10) Patent No.: US 7,091,569 B2
(45) Date of Patent: Aug. 15, 2006

(54) GATE AND CMOS STRUCTURE AND MOS STRUCTURE

(75) Inventors: Toyohiro Chikyo, Ibaraki (JP); Motoharu Imai, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 10/469,307

(22) PCT Filed: Mar. 1, 2002

(86) PCT No.: PCT/JP02/01904

§ 371 (c)(1),
(2), (4) Date: Jan. 13, 2004

(87) PCT Pub. No.: WO02/073700

PCT Pub. Date: Sep. 19, 2002

(65) Prior Publication Data

US 2004/0104441 A1    Jun. 3, 2004

(30) Foreign Application Priority Data

Mar. 2, 2001    (JP) .............................. 2001-059173

(51) Int. Cl.
*H01L 29/76*    (2006.01)
(52) U.S. Cl. ...................................... 257/412; 257/407
(58) Field of Classification Search ................ 257/412, 257/413, 407, 369
See application file for complete search history.

(56) References Cited

U.S. PATENT DOCUMENTS

| | | | | |
|---|---|---|---|---|
| 3,617,824 A | * | 11/1971 | Shinoda et al. | 257/407 |
| 6,042,969 A | * | 3/2000 | Yamada et al. | 429/218.1 |
| 6,287,903 B1 | * | 9/2001 | Okuno et al. | 438/197 |
| 6,884,543 B1 | * | 4/2005 | Tsujimoto et al. | 429/223 |
| 2004/0104441 A1 | * | 6/2004 | Chikyo et al. | 257/388 |

FOREIGN PATENT DOCUMENTS

| | | |
|---|---|---|
| JP | 55-121667 | 9/1980 |
| JP | 59-33875 | 2/1984 |
| JP | 59-114868 | 7/1984 |

OTHER PUBLICATIONS

Takashi Ito et al., "VLSI no Hakumaku Gijutsu", Maruzen Co., Ltd., pp. 171 to 181, Sep. 30, 1986.

Kazuo Maeda, "Saishin LSI Process Gijutsu (4th edition)", Kogyo Chosakai Publishing Co., Ltd., pp. 397 to 399, Apr. 20, 1988.

\* cited by examiner

*Primary Examiner*—Mark V. Prenty
(74) *Attorney, Agent, or Firm*—Wenderoth, Lind & Ponack, L.L.P.

(57) ABSTRACT

Provided are a novel gate, a CMOS structure, and a MOS structure each of that has low resistance and excellent controllability. The gate is comprised of an intermetallic compound semiconductor that has an electric conductivity in a range of no less than $10^2$ S·m$^{-1}$, nor more than $10^5$ S·m$^{-1}$ without impurities and has a band structure like that of a semiconductor.

2 Claims, 4 Drawing Sheets

GATE AND CMOS STRUCTURE AND MOS STRUCTURE

FIELD OF THE INVENTION

The invention of this application relates to a gate, CMOS structure, and MOS structure. More particularly, the invention of this application concerns a novel gate that replaces a conventional gate and that is useful for a next-generation integrated circuit, and a novel CMOS structure and MOS structure each of that uses that gate.

DESCRIPTION OF THE RELATED ART

The requirements that are demanded regarding the next-generation integrated circuits are (1) the increase in the integrated level, (2) the increase in the speed, and (3) the decrease in the power consumption. As a structure that satisfies these requirements, a Complementary Metal Oxide Semiconductor (CMOS) structure is known.

For example, as illustrated in FIG. 3, a field effect transistor (FET) of a conventional CMOS structure uses a silicon oxide film of $SiO_2$ as a gate insulative film (2) and has its gate constructed of a gate (1) that uses polycrystalline silicon (polysilicon) made to contain an n-type impurity therein.

Ordinarily, the threshold value voltage Vth that is a voltage that allows a bias voltage to be applied to the gate (1) to thereby start causing the flow of a channel-opening current is determined depending basically upon the Fermi level of a substrate Si and that of the gate material. For this reason, in the CMOS structure, the threshold voltage Vth differs between the n-type substrate and a p-type substrate.

On this account, because for making the CMOS operation stable it is necessary to make the both threshold voltages Vth substantially the same in level, the Vth is conventionally controlled by performing ion-implantation of impurities into either channel region.

In this case, as illustrated, one channel is a surface channel and the other one is a buried channel. And, in case of the polycrystalline Si that is a semiconductor, the position of the Fermi level can be controlled over a wide range by changing the impurity concentration therein and, accordingly, the Vth can be freely set and controlled also with respect to the electric conductivity (p, n) of the substrate.

However, the conventional CMOS structure as described above has the following problems when trying to further increase the integrated version level of the integrated circuit.

Namely, the demand for the micronizing of the gate wire width that is important for high integration has more and more increased, and therefore it is necessary to prevent the increase in the resistance following such micronization. However, as described above, in the case of the polycrystalline Si gate (1) made by doping the polycrystalline Si with impurities, a limit has started to be imposed upon the suppression of the resistance.

In order to solve this problem, constructing the gate (1) using metal has been proposed, and as a result, the using of a high-melting point metal such as tungsten has nowadays been studied and examined. However, in case of a metal gate, it is pointed out that the following problems come up. Namely, (a) because the Vth is determined in accordance with the work function of the Fermi level of the backing Si and the metal, the range of control of the Fermi level that had theretofore been freely set becomes narrow, with the result that the problem that the Vth becomes difficult to control arises. (b) The adherences between the metal and gate insulative films such as $SiO_2$ are bad. (c) Owing to the diffusion of the metal there increases the leak current of the gate insulative film. (d) The metal becomes diffused up to the channel region, whereby trap of the carriers occurs. And so forth.

Also, recently, the metal silicide (3) which is an intermetallic compound having an electric conductivity substantially the same as that of metal has been found out as being usable. Thereby, providing it on the polycrystalline Si gate (1) as illustrated in FIG. 4 has been proposed with an aim to decrease the gate resistance even to a small extent. However, even in this case, although the above-described problems such as those following the use of metal do not exist, because the metal silicide (3) is merely provided on the gate (1), it doesn't happen that the resistance of the gate (1) itself will decrease. Therefore, realizing the remarkable decrease in the resistance is not expected.

The invention of this application has been made in view of the existing circumstances mentioned above and has an object to provide a novel gate that can solve the points in problem inherent in the prior art, that can realize the decrease in resistance to such an extent as not in the prior art, and that can greatly contribute to further increasing the integrated version level of the integrated circuit, and a novel CMOS structure and MOS structure each of that uses such gate.

DISCLOSURE OF INVENTION

To attain the above object, the invention of this application provides a gate (first aspect) comprising an intermetallic compound semiconductor that has an electric conductivity in a range of no less than $10^2$ S·m$^{-1}$, nor more than $10^5$ S·m$^{-1}$ without impurities and that has a semiconductor band structure. Also, the invention of this application provides a gate (second aspect) wherein, impurities are added to the said intermetallic compound semiconductor.

Also, the invention of this application also provides a gate wherein, in the above-described gate, the intermetallic compound semiconductor is a compound of a metal and a IV-group element (third aspect) or wherein, in the above-described gate, any of C, Si, and Ge is used as the IV-group element (fourth aspect.)

The invention of this application also provides a gate wherein, in the above-described gate, (fifth aspect), any one intermetallic compound semiconductor of $CrSi_2$, $MnSi_2$, $MoSi_2$, $Ru_2Si_3$, $WSi_2$, $ReSi_{1.75-2}$, $OsSi$, $OS_2Si_3$, $OsSi_2$, $FeSi_2$, $IrSi_2$, $BaSi_2$, $CaSi_2$ and $Mg_2Si$ is used.

Further, the invention of this invention also provides a CMOS structure that uses the above-described gate (sixth aspect), or a MOS structure that uses the above-described gate (seventh aspect).

Figure 1:
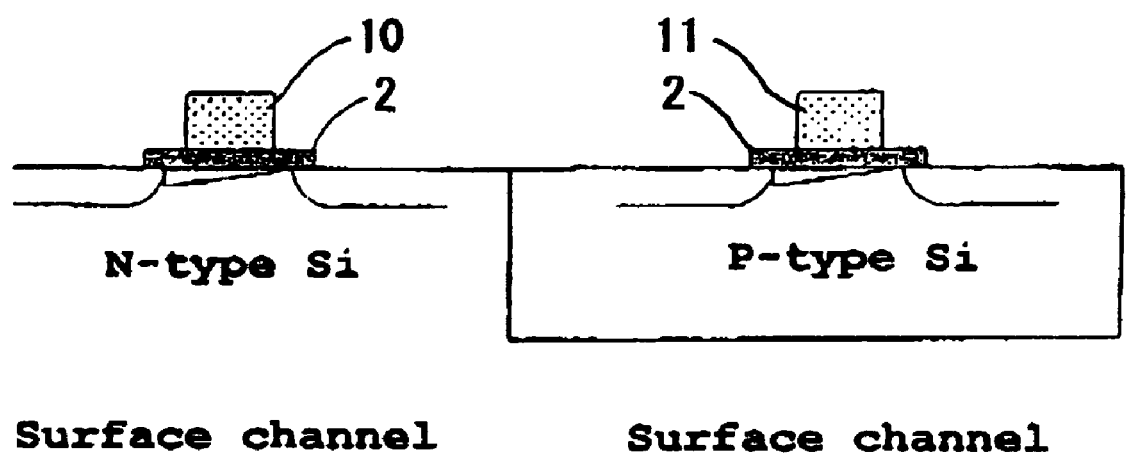
FIG. 1 is a view illustrating a CMOS structure that uses a gate according to an embodiment of the invention of this application.

Here, reference numerals in the drawings designate as follows:
1. Gate
2. Gate insulative film
3. Metal silicide
4. Gate for use for n type
5. Gate for use for p type

BEST MODES FOR CARRYING OUT THE INVENTION

The invention of this application has been achieved based on the completely new knowledge procured by the inventors of the invention of this application that as the material for the gate there is used an an intermetallic compound semiconductor, i.e. one having an electric conductivity in a range of no less than $10^2$ S·m$^{-1}$, nor more than $10^5$ S·m$^{-1}$ without impurities and also having a semiconductor band structure. As a result of this, the invention of this application can be a basic technique that enables realizing further decrease in the resistance and that therefore is indispensable to the integrated circuit of the next generation and the next, but that next, generation.

More specifically, this intermetallic compound semiconductor (1) has an electric conductivity in a range of no less than $10^2$ S·m$^{-1}$, nor more than $10^5$ S·m$^{-1}$ without impurities. (2) has a semiconductor band structure, and (3) is a semiconductor compound that is comprised of metal and a semiconductor.

First, (1) that the intermetallic compound semiconductor has an electric conductivity in a range of no less than $10^2$ S·m$^{-1}$, nor more than $10^5$ S·m$^1$ without impurities. The electric conductivity of a semiconductor in general is in a range of from $10^{-2}$ to $10^4$ S·m$^{-1}$ at normal temperature, whereas an electric conductivity of metal in general is in a range of from $10^6$ to $10^8$ S·m$^{-1}$ at normal temperature. An intermetallic compound semiconductor, which is used for a gate material of the invention of this application, has a electric conductivity closed to an electric conductivity of metal compare to a semiconductor in general. Also, the electric conductivity of the intermetallic compound semiconductor can be improved by adding impurities.

Next, (2) the wording "a semiconductor band structure" means that the intermetallic compound semiconductor has an electric-conduction mechanism that enables freely controlling the Fermi level. As a result of this, it becomes possible to control the threshold voltage Vth, whereby it becomes possible to realize a gate for use for n type on the n-type substrate and a gate for use for p type on the p-type substrate. Namely, owing to this property, the intermetallic compound semiconductor becomes able to be used as the material for use for gate.

(3) Regarding the semiconductor compound of metal and a semiconductor that can be the material having the above-described two properties, for example, there is a compound of metal and an element of the IV-group. More specifically, there can be taken up as examples thereof the compounds of metals and silicon such a $CrSi_2$, $MnSi_2$, $MoSi_2$, $Ru_2Si_3$, $WSi_2$, $ReSi_{1.75-2}$, $OsSi$, $Os_2Si_3$, $OsSi_2$, $FeSi_2$, $IrSi_2$, $BaSi_2$, $CaSi_2$, $Mg_2Si$ or the compounds the compositions of that each are in the neighborhood of that of those compounds. The compounds in this case can be called "semiconductor silicides". In addition, there can be also taken up as such examples compounds of metal and C or Ge. Furthermore, compounds of metal and Si and C or Ge can also be said material. And, for example, in the case of $FeSi_2$, pn control becomes possible by doping Co and Cr.

The gate according to the invention of this application that consists of the intermetallic compound semiconductor having the above-described properties not only has excellent low resistance but also enables realizing easy control. The freedom in which the CMOS structure can be designed is thereby greatly widened. Also, since both of the np channels become surface channels, it is also possible to avoid having the short-channel effect. Furthermore, the ion-implantation of impurities that needed to be so far performed becomes unnecessary, whereby the property of the channel region being crystalline can also be ensured.

And, through the use of this gate, it is possible to realize the CMOS structure that is simple and that has excellent controllability of process. Of course, the gate according to the invention of this application can needless to say be applied also to the MOS structure. Excellent effects that are as in the case of the CMOS structure are realized.

While the invention of this application has the characterizing features as described above, an example thereof will hereafter be described along the drawings annexed hereto to thereby give a more detailed explanation of the mode of this invention.

EXAMPLE

FIG. 1 illustrates a CMOS structure that uses a gate according to an embodiment of the invention of this application. And any one intermetallic compound semiconductor of $CrSi_2$, $MnSi_2$, $MoSi_2$, $Ru_2Si_3$, $WSi_2$, $ReSi_{1.75-2}$, $OsSi$, $Os_2Si_3$, $OsSi_2$, $FeSi_2$, $IrSi_2$, $BaSi_2$, $CaSi_2$ and $Mg_2Si$ is used for the gate material. In this CMOS structure, by controlling a pn conduction mechanism of the intermetallic compound semiconductor, a gate (10) for use for n type is provided on an n-type substrate and a gate (11) for use for p-type is provided on a p-type substrate.

In this case, as stated previously, it is not only possible to make the resistance lower but do the both channels also become surface channels. Therefore, the illustrated CMOS structure does not have the short-channel effect which conventionally occurred in the buried channel in the CMOS structure. Resultantly, the illustrated CMOS structure provides a gate and CMOS structure that are again better for conversion into an integrated version.

Figure 2:
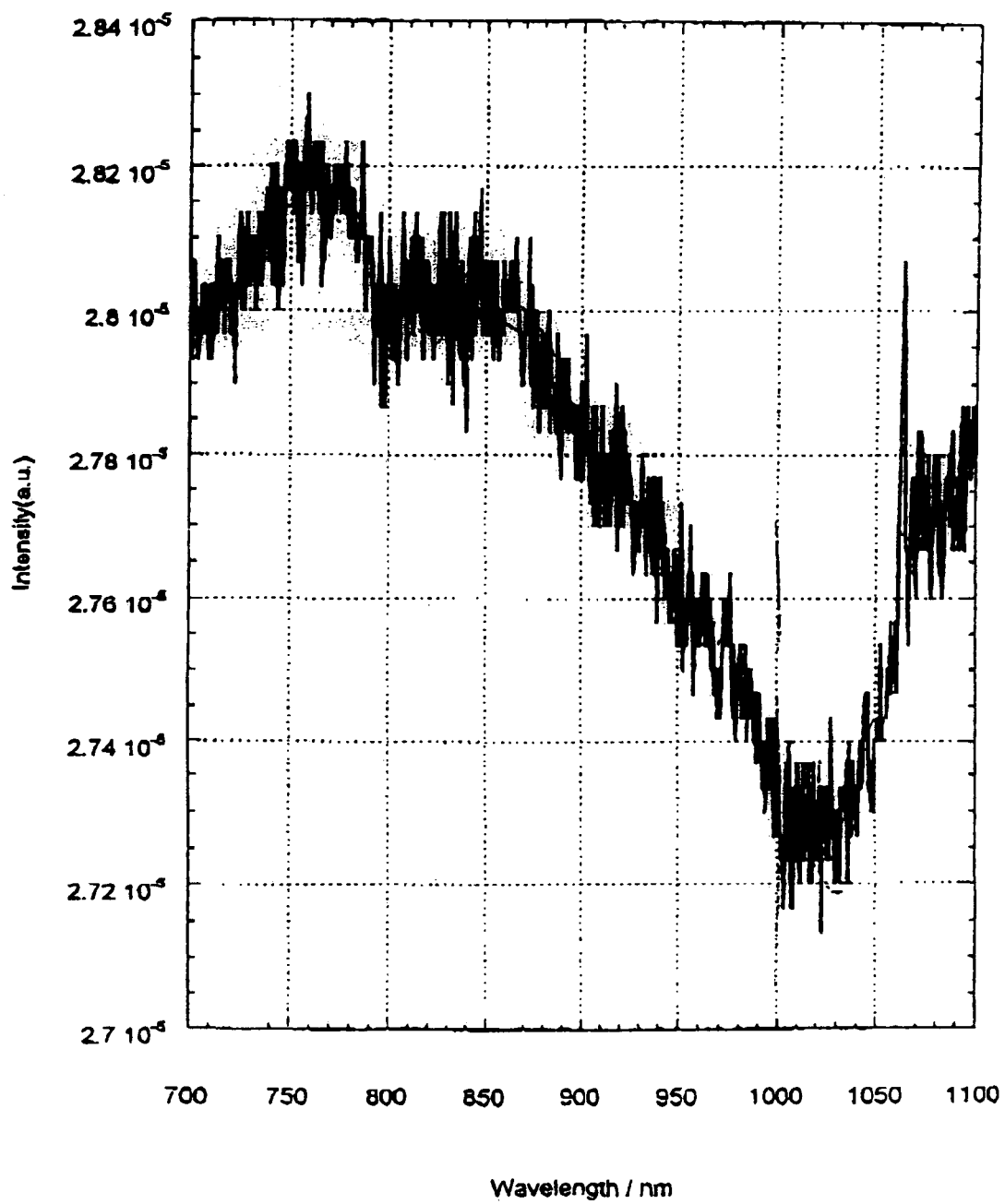
FIG. 2 is a graph of relation between wavelength—spectral intensity of $IrSi_2$ according to an embodiment of the invention of this application.
Figure 3:
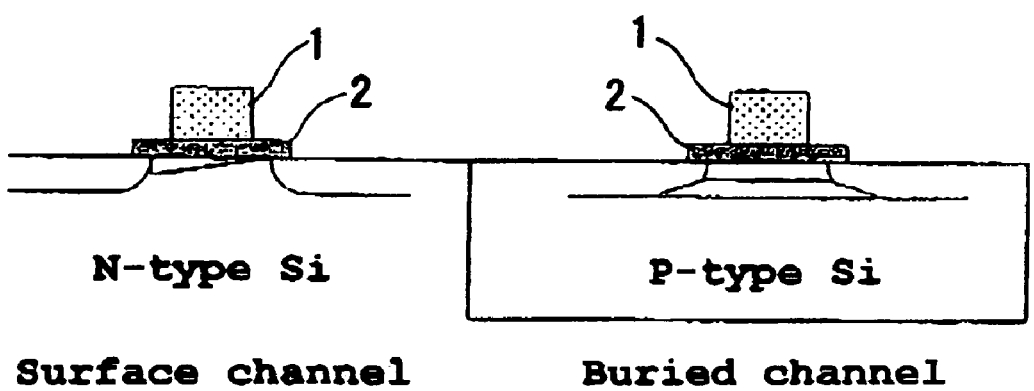
FIG. 3 is a view illustrating a conventional CMOS structure.
Figure 4:
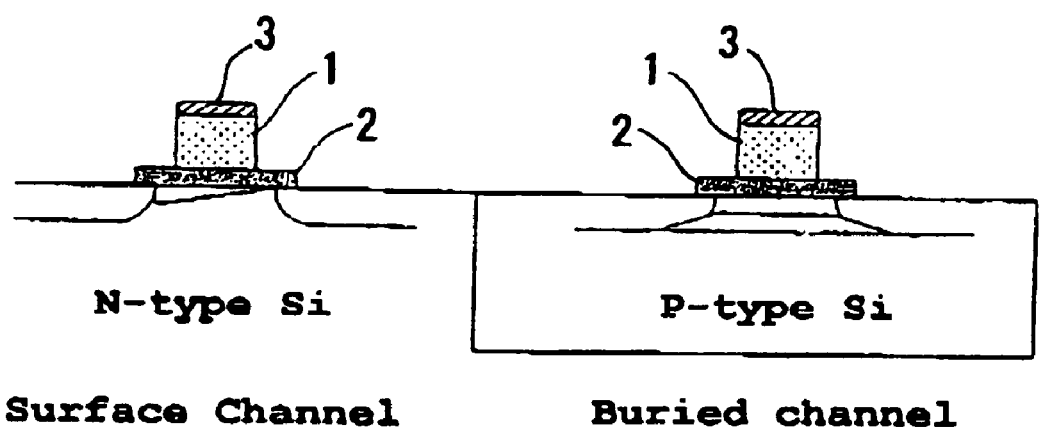
FIG. 4 is a view illustrating another conventional CMOS structure.

Also, FIG. 2 shows a graph of light absorption spectrum of $IrSi_2$ as an embodiment of above-described intermetallic compound semiconductor. The vertical axis in FIG. 2 shows spectral intensity and the horizontal axis in FIG. 2 shows wavelength.

As FIG. 2 shows, the band gap of $IrSi_2$ is 1.13 eV because of there is spectral absorption around 1100 nm wavelength. That is, it shows that the $IrSi_2$ has a semiconductor band structure.

Of course, the invention is not limited to the above-described example but permits various aspects to be made regarding finer portions of the invention.

INDUSTRIAL APPLICABILITY

As has been explained above in detail, by the invention of this application, there is realized a novel gate for the next generation that has excellent low resistance characteristics and excellent controllability, and there are also provided a novel CMOS structure and MOS structure each of that uses that gate to thereby enable a further development of the integrated circuit.

What is claimed is:

1. A CMOS structure comprising a gate comprising an intermetallic compound semiconductor selected from the group consisting of $MnSi_2$, $Ru_2Si_3$, $Os_2Si_3$, $OsSi_2$, $BaSi_2$, and $Mg_2Si$, wherein the intermetallic compound semiconductor is without impurities, has an electric conductivity in a range of no less than $10^2$ S·m$^{-1}$, nor more than $10^5$ S·m$^{-1}$, and has a semiconductor band structure.

2. A MOS structure comprising a gate comprising an intermetallic compound semiconductor selected from the group consisting of $MnSi_2$, $Ru_2Si_3$, $Os_2Si_3$, $OsSi_2$, $BaSi_2$, and $Mg_2Si$, wherein the intermetallic compound semiconductor is without impurities, has an electric conductivity in a range of no less than $10^2$ S·m$^{-1}$, nor more than $10^5$ S·m$^{-1}$, and has a semiconductor band structure.

* * * * *